US007466970B2

(12) United States Patent
Niiranen et al.

(10) Patent No.: US 7,466,970 B2
(45) Date of Patent: Dec. 16, 2008

(54) ARRANGEMENT FOR DIVIDING A FILTER OUTPUT SIGNAL

(75) Inventors: Erkki Niiranen, Ii (FI); Harri Narhi, Kempele (FI); Jukka Puoskari, Tupos (FI); Pertti Koskela, Kempele (FI)

(73) Assignee: Filtronic Comtek Oy, Kempele (FI)

( * ) Notice: Subject to any disclaimer, the term of this patent is extended or adjusted under 35 U.S.C. 154(b) by 634 days.

(21) Appl. No.: 11/264,478

(22) Filed: Oct. 31, 2005

(65) Prior Publication Data

US 2006/0252400 A1 Nov. 9, 2006

Related U.S. Application Data

(63) Continuation of application No. PCT/FI2005/050060, filed on Mar. 3, 2005.

(30) Foreign Application Priority Data

Mar. 22, 2004 (FI) ................................ 20040432

(51) Int. Cl.
*H04B 1/18* (2006.01)
*H01P 1/20* (2006.01)
*H03H 9/00* (2006.01)

(52) U.S. Cl. ...................... 455/286; 455/280; 455/269; 333/202; 333/186; 333/219

(58) Field of Classification Search ................. 455/269, 455/271, 280, 282, 286, 289, 291; 333/100, 333/117, 122, 128, 158, 186, 194, 197, 200, 333/201, 202, 204, 208, 219, 219.1; 343/722, 343/850, 700 MS
See application file for complete search history.

(56) References Cited

U.S. PATENT DOCUMENTS 4,074,214 A * 2/1978 Aichholzer ................ 333/204

(Continued)

FOREIGN PATENT DOCUMENTS

EP 1 191 626 A2 3/2002

(Continued)

OTHER PUBLICATIONS

International Preliminary Report on Patent Ability for International Application No. PCT/FI2005/050060 dated Sep. 26, 2006.

*Primary Examiner*—Duc M Nguyen
(74) *Attorney, Agent, or Firm*—Darby & Darby P.C.

(57) ABSTRACT

An arrangement for dividing the output signal of the antenna filter of a radio receiver to two different paths, such as two parallel low-noise amplifier branches of a base station. The divider circuit is physically integrated into a resonator-type antenna filter (RXF). This takes place by placing some conductors (332, 333) of the divider inside some conductive part of the filter structure or the resonator cavity and by using the coupling conductor (331) of the output resonator as part of the input line of the divider at the same time. As the divider is used a Wilkinson divider. Due to the arrangement, a transmission line between the antenna filter and the divider becomes unnecessary, and the dielectric losses of the divider are reduced as compared to the prior art, in which case correspondingly inferior noise qualities can be allowed for low-noise amplifiers.

14 Claims, 3 Drawing Sheets

U.S. PATENT DOCUMENTS

| | | | | | |
|---|---|---|---|---|---|
| 4,490,699 | A | | 12/1984 | Yanagida | |
| 5,023,866 | A | * | 6/1991 | De Muro | 370/278 |
| 5,124,110 | A | * | 6/1992 | Yokobayashi | 264/520 |
| 5,539,415 | A | * | 7/1996 | Metzen et al. | 343/700 MS |
| 5,659,274 | A | * | 8/1997 | Takahashi et al. | 333/204 |
| 5,691,676 | A | * | 11/1997 | Snel et al. | 333/204 |
| 6,041,224 | A | * | 3/2000 | Wada | 455/327 |
| 2007/0132528 | A1 | * | 6/2007 | Niiranen et al. | 333/128 |

FOREIGN PATENT DOCUMENTS

| | | | | |
|---|---|---|---|---|
| GB | 2 306 792 | | * | 5/1997 |
| JP | 58-157201 | A | | 9/1983 |
| JP | 8-195603 | A | | 7/1996 |

* cited by examiner

ARRANGEMENT FOR DIVIDING A FILTER OUTPUT SIGNAL

CROSS REFERENCE TO PRIOR APPLICATION

This application is a continuation of International Patent Application Ser. No. PCT/FI2005/050060, filed Mar. 3, 2005, which claims priority of Finnish Application No. 20040432, filed Mar. 22, 2004, both of which are incorporated by reference herein. PCT/FI2005/050060 published in English on Sep. 29, 2005 as WO 2005/091426 A1.

The invention relates to an arrangement for dividing the output signal of the antenna filter of a radio receiver to two different paths. The arrangement is suitable for use on the receiving side of base stations of mobile communication networks and satellite receivers, for example, wherein the low-noise amplifier unit consists of two parallel and phased amplifier branches.

BACKGROUND OF THE INVENTION

In all radio receivers, the first amplifier after the antenna when entering the receiver should be especially low noise type, because the signal level at the input of this amplifier is very low, and the additional noise caused by the amplifier is amplified in all the following amplifier stages. An abbreviation LNA is used of such a low-noise preamplifier. Some allowed maximum value is generally specified in receivers for the total noise figure of the LNA and its input and output circuits. Losses on the transmission path cause signal attenuation, which directly increases the noise figure by the same amount. Hence, for example, if the antenna filter of the receiver is very low loss, the noise figure of the LNA can be correspondingly a little higher.

FIG. 1 shows a block diagram of the common structure of the antenna side part of a receiver. In addition to the antenna and a possible antenna switch, the structure includes an antenna filter and an amplifier unit AU. In the example of the figure, the antenna filter RXF has two parts: Starting from the antenna, there is first a bandpass filter 110 and then a low-pass filter 120. These filters can form a mechanically integrated structure. The former attenuates frequency components outside the receiving band of the radio system, and the latter further cleans up the area above the reception band. The amplifier unit AU has two parallel amplifier branches. For this, the signal $E_{in}$ coming from the low-pass filter 120 is divided into two identical parts $E_{11}$, and $E_{21}$ in the divider 130. The phase of the first division signal $E_{11}$ is changed 90 degrees in the phase shifter 140 and then amplified in the first LNA 150. The phase shifter gives a delayed signal $E_{1p}$, and the first LNA gives the signal $E_{12}$. The second division signal $E_{21}$ is amplified in the second LNA 160, and the phase of the signal is then changed 90 degrees in the second phase shifter 170, which gives the signal $E_{22}$. Again, the in-phase signals $E_{12}$ and $E_{22}$ are summed in a combiner 180, the output signal of which, $E_{out}$, continues towards the mixer of the receiver. Compared to a single LNA, the impedance matching of the amplifier unit described above is easier, especially towards the antenna filter. In addition, a wider dynamic and linear area and a better stability are achieved. On the other hand, the divider, the phase shifter and the additional wiring required by them cause more attenuation in the signal, which directly impairs the noise figure of the amplifier branch.

FIG. 2 shows an example of a known arrangement according to FIG. 1 for dividing the received signal before amplification. It comprises a circuit board 101, the lower surface of which, not visible in the figure, is conductive and functions as the signal ground GND. The integrated antenna filter RXF comprises resonators, and its output is connected through a connector 125 on its end wall to a coaxial cable 129, which has a characteristic impedance of 50Ω. The conductive cable sheath is connected to the signal ground at both ends. The cable 129 continues on the circuit board 101 as a transmission line, which consists of a strip conductor 131 on the upper surface of the board, a ground conductor on the lower surface and dielectric material between them. The transmission line is dimensioned so that its characteristic impedance is 50Ω. It belongs to the divider 130 as its input line. The divider is of the Wilkinson type, which means that the input line mentioned above branches into two transmission lines, the length of which on the operating frequency is λ/4 and the characteristic impedance $\sqrt{2}\cdot 50 \approx 71\Omega$. One of the two transmission line branches is formed of the first division conductor 132 on the upper surface of the board, a ground conductor on the lower surface and dielectric material between them, and the second branch correspondingly of the second division conductor 133 on the upper surface of the board, a ground conductor on the lower surface and dielectric material between them. A Wilkinson divider is formed when the tail ends of the first and the second division conductor have been connected together by a resistor 134 of the size of $2\cdot 50=100\Omega$. In that case, if both transmission line branches have been terminated by an impedance of 50Ω, the energy coming from the filter is divided into them half and half, and theoretically without losses. Thus, the divider does not consume energy in spite of the resistor 134 in it. Only if the matching on the transmission paths continuing forward is inadequate, the resistor 134 causes losses. In addition, a good isolation between the branches is achieved. The phase shifter 140 in FIG. 1 has been implemented with a quarter-wave long transmission line, of which the strip conductor 141 as the continuation of the first division conductor 132 is seen in FIG. 2. This terminates at the input pin of the first LNA 150. The second division conductor 133 terminates directly at the input pin of the second LNA 160.

The arrangement according to FIG. 2 has the drawback of losses that occur in it in practice: the circuit board material causes dielectric losses in the divider 130 and in the phase shifter 140, the size of the losses being typically 0.2-0.5 dB in the former and 0.1-0.3 dB in the latter. The transmission line 129 from the filter to the divider and its connectors cause more losses, the size of which can be several tenths of a decibel, naturally depending on the length of the line. These attenuations directly increase the noise figure of the amplifier unit by the same amount. Then the requirements for the LNA itself correspondingly increase if the total noise figure must remain as low as possible.

SUMMARY OF THE INVENTION

The purpose of the invention is to reduce the above mentioned drawbacks of the prior art. The arrangement according to the invention is characterized in what is set forth in the independent claim 1. Some preferred embodiments of the invention are set forth in the other claims.

The basic idea of the invention is the following: The divider circuit of the low-noise amplifier unit of a receiver is physically integrated into a resonator type antenna filter. This takes place by placing some conductors of the divider inside some conductive part of the filter structure or in the resonator cavity and by using the coupling wire of the output resonator as part of the input line of the divider, at the same time. A theoretically lossless structure, such as a Wilkinson divider, is used as the divider.

The invention has the advantage that the losses of the low-noise amplifier unit of the receiver are reduced. This is due to the fact that a transmission line is not needed between the antenna filter and the divider, and also due to the fact that the dielectric losses of the divider can be reduced as compared to the prior art. The reduction of losses means an improvement in the noise figure of the amplifier unit, in which case inferior noise qualities can be allowed for its both LNAs, which further means saving of costs in amplifiers. In addition, the invention has the advantage that it simplifies the structure of the amplifier unit, which means saving of costs in production.

BRIEF DESCRIPTION OF THE DRAWINGS

In the following, the invention will be described in more detail. Reference will be made to the accompanying drawings, in which.

DETAILED DESCRIPTION OF THE INVENTION

Figure 1:
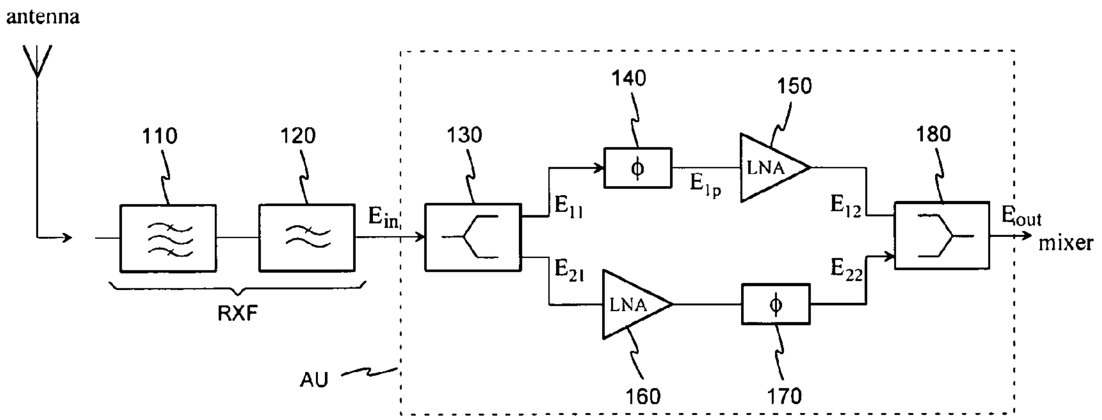
Fig. 1 PRIOR ART
FIG. 1 shows a block diagram of a common structure of the antenna side part of a receiver.
Figure 2:
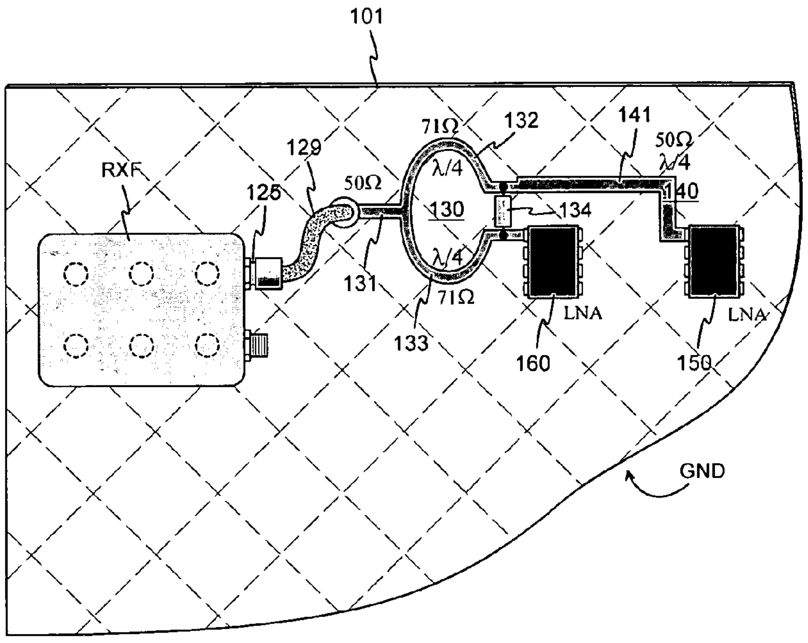
Fig. 2 PRIOR ART
FIG. 2 shows an example of a known arrangement according to FIG. 1 for dividing the received signal.

FIGS. 1 and 2 were already discussed in connection with the description of the prior art.

Figure 3:
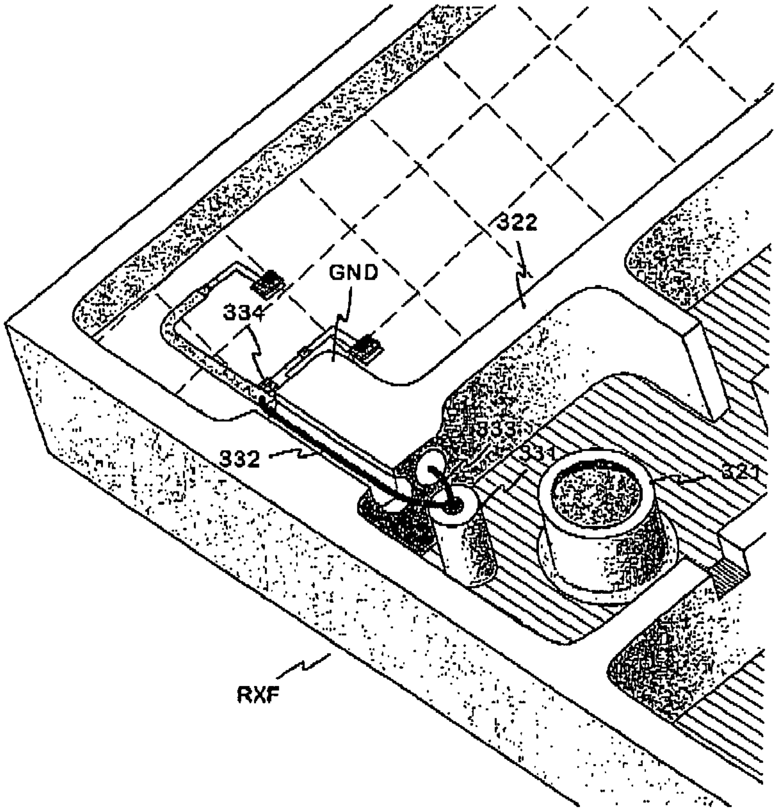
FIG. 3 shows an example of an arrangement according to the invention for dividing the received signal.

FIG. 3 shows an example of an arrangement according to the invention for dividing the received signal before amplification. The figure shows part of the receiver antenna filter with its cover removed. The antenna filter RXF is of the resonator type and consists of air-insulated coaxial resonators connected in series. The bottom of the whole filter, its side walls and cover form a conductive filter housing, the inner space of which is divided by conductive partition walls into resonator cavities. The partition walls delimiting a single cavity and parts of the side walls of the filter form the outer conductor of the resonator in question. In the cavity there is the inner conductor of the resonator, which inner conductor is galvanically fastened to the bottom at its lower end, and thus the resonator is shorted at its lower end. At the upper end each resonator is electrically open, and thus the structure functions as a quarter-wave resonator. FIG. 3 shows the output resonator of the antenna filter, i.e. the resonator from which the signal energy is taken out. For taking the energy out, there is a conductor element 331 in the cavity of the output resonator, in the space between its inner conductor 321 and outer conductor. In the case of the example, this is a cylindrical conductor parallel with the inner conductor joining galvanically to the bottom of the resonator. When a conductor extending outside the resonator is connected on the upper end of the conductor element 331, the line formed by that conductor and a ground conductor connected to the filter housing can be used to transfer energy of the high frequency field in the cavity to an external load. In this case, two conductors have been connected to the upper end of the conductor element 331 for dividing the signal, the first 332 and the second 333 division conductor. These division conductors run parallel through an enlargement formed on the conductive outer wall 322 of the output resonator, each conductor surrounded by a cylindrical dielectric mass. The conductive wall functions as the signal ground GND. The division conductor, the conductive wall and the dielectric mass between them form a division line. The thickness of the wall, the diameter of the cylinder holes in it, i.e. the diameter of the dielectric cylinders and the dielectric material have been chosen so that the electric length of the division lines is a quarter of the wavelength on the operating band, and their characteristic impedance is $\sqrt{2}\cdot Z_0$. $Z_0$ is the desired impedance level of the radio frequency transmission paths, such as 50Ω. The tail ends of the division conductors have been connected together by a resistor 334, which has a resistance of $2Z_0$. The above mentioned conductor element 331 has been located and dimensioned so that the impedance "seen" from the starting end of the division conductors, or from the side of the resonator cavity, is $Z_0$. Thus the structure described functions as a Wilkinson divider in the same way in principle as the divider in FIG. 2.

The division conductors can also be implemented as air-insulated. The conductors are then so sturdy and fastened so strongly that they endure reasonable mechanical stress without a change in their properties. The cross-section of the holes for the division conductors can be shaped like a square or a rectangle instead of a circle. In the same way, the division conductors can have a rectangular cross-section, regardless of the shape of the holes.

According to the invention, the conductor element 331 located in the cavity of the output resonator and implementing the electromagnetic coupling, which conductor element is needed in any case, functions as an input conductor of the Wilkinson divider at the same time. The input line of the divider can be said to be formed of the input conductor, the surrounding parts of the filter housing and the air space between them. There is thus no intermediate cable or connector between the filter and the divider, which means a substantial reduction in attenuation. Another factor that affects in the same direction is the fact that a low-loss dielectric material can be chosen in the branches of the divider around the division conductors. In addition, when the amount of this material is smaller than in the circuit board structure according to FIG. 2, for example, the amount of dielectric losses is also reduced. In practice, adding the divider causes an additional attenuation of only 0.05-0.1 dB in the signal.

In FIG. 3, the filter housing has been enlarged on one side of the actual filter. A circuit board has been located in the additional cavity thus created for the radiofrequency circuits after the divider.

Figure 4:
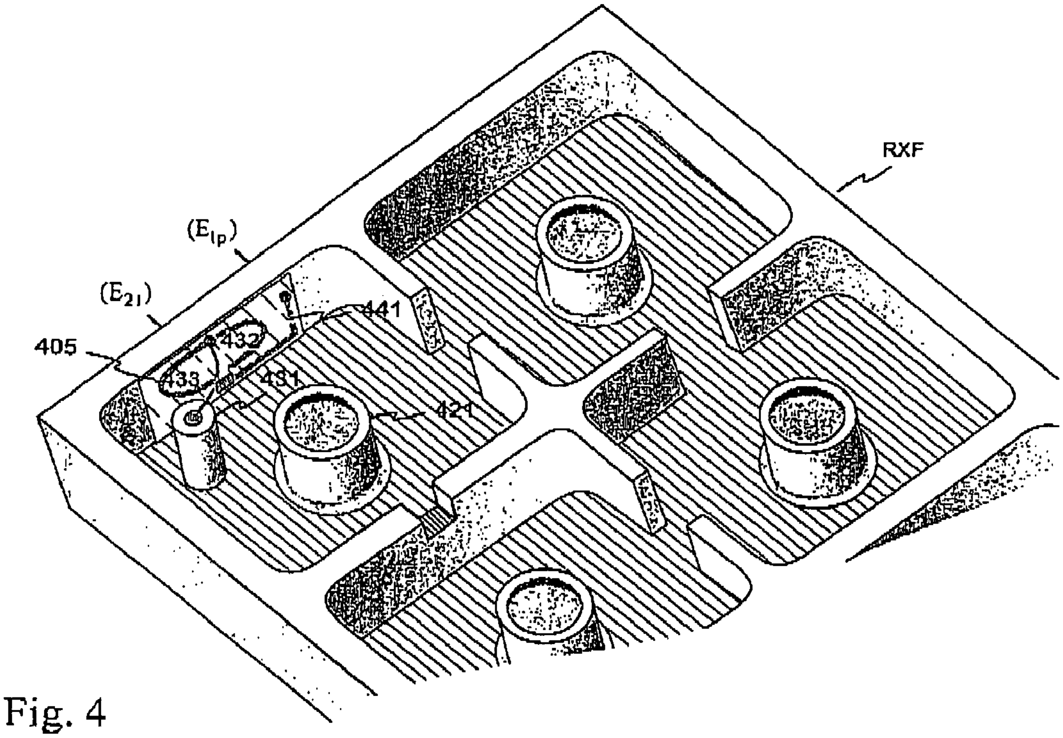
FIG. 4 shows another example of an arrangement according to the invention for dividing the received signal.

FIG. 4 shows another example of an arrangement according to the invention for dividing the received signal before amplification. The figure shows part of the antenna filter RXF with its cover removed. This, too, is a resonator filter consisting of air-insulated quarter-wave coaxial resonators. The bottom of the filter, its side walls and cover form a conductive filter housing, the inner space of which is divided by conductive partition walls into resonator cavities. In the cavity of the output resonator of the filter, in the space between its inner conductor 421 and its outer conductor, there is a conductor element 431 for coupling to the resonator for taking out energy. In this example, the signal divider circuit is entirely located in the cavity of the output resonator. The upper end of the conductor element 431 is connected by a short intermediate conductor to a small circuit board 405 fastened to the inner surface of a resonator wall. On the surface of the circuit board on the cavity side there is the first 432 and the second 433 division conductor of the divider and a resistor connecting the tail ends thereof in a similar manner as in the divider in FIG. 2. The strip conductor 441 of the transmission line that functions as a phase shifter is also connected to the tail end of the first division conductor 432. The conductive wall at the circuit board functions as the ground conductor of the division lines and the transmission line. The signals are taken out from the housing through the vias of this wall. The delayed first division signal $E_{1p}$ and the second division signal $E_{21}$ have been marked in FIG. 4 in accordance with the markings in FIG. 1.

In FIG. 4, the conductor element 431 and said intermediate conductor as its extension together implement the electromagnetic coupling to the output resonator. Thus, at the same time, they function as the input conductor of the Wilkinson divider. Neither in this case there is any intermediate cable or connector between the filter and the divider that would increase attenuation. In addition, due to its dielectric material and size, the circuit board 405 causes less losses than in structures like FIG. 2.

FIGS. 5*a-f* show six other examples of an arrangement according to the invention for dividing the received signal before amplification. The output resonator of the antenna filter is presented as a longitudinal section in them. In accordance with the markings of FIG. 5*a*, the bottom 5*a*3, the inner conductor 5*a*1, the part 5*a*2 that belongs to the filter housing of the outer conductor and the cover 5*a*4 are shown of the resonators. The structure according to FIG. 5*a* corresponds to the one shown in FIG. 4 with the difference that the coupling of the divider to the resonator is galvanic instead of electromagnetic: The feed conductor 5*a*6 of the divider is connected at one end to a circuit board 5*a*5 fastened on the inner surface of the outer wall and at the other end to the inner conductor 5*a*1. The structure according to FIG. 5*b* corresponds to the one shown in FIG. 5*a* with the difference that the circuit board 5*b*5 including the divider proper is now against the inner surface of the resonator cover. The cover operates as the ground conductor of the division lines. The structure according to FIG. 5*c* corresponds to the one shown in FIGS. 5*a* and 5*b* with the difference that the circuit board 5*c*5 including the divider proper is now against the inner surface of the resonator bottom. The bottom functions as the ground conductor of the division lines.

Figure 5:
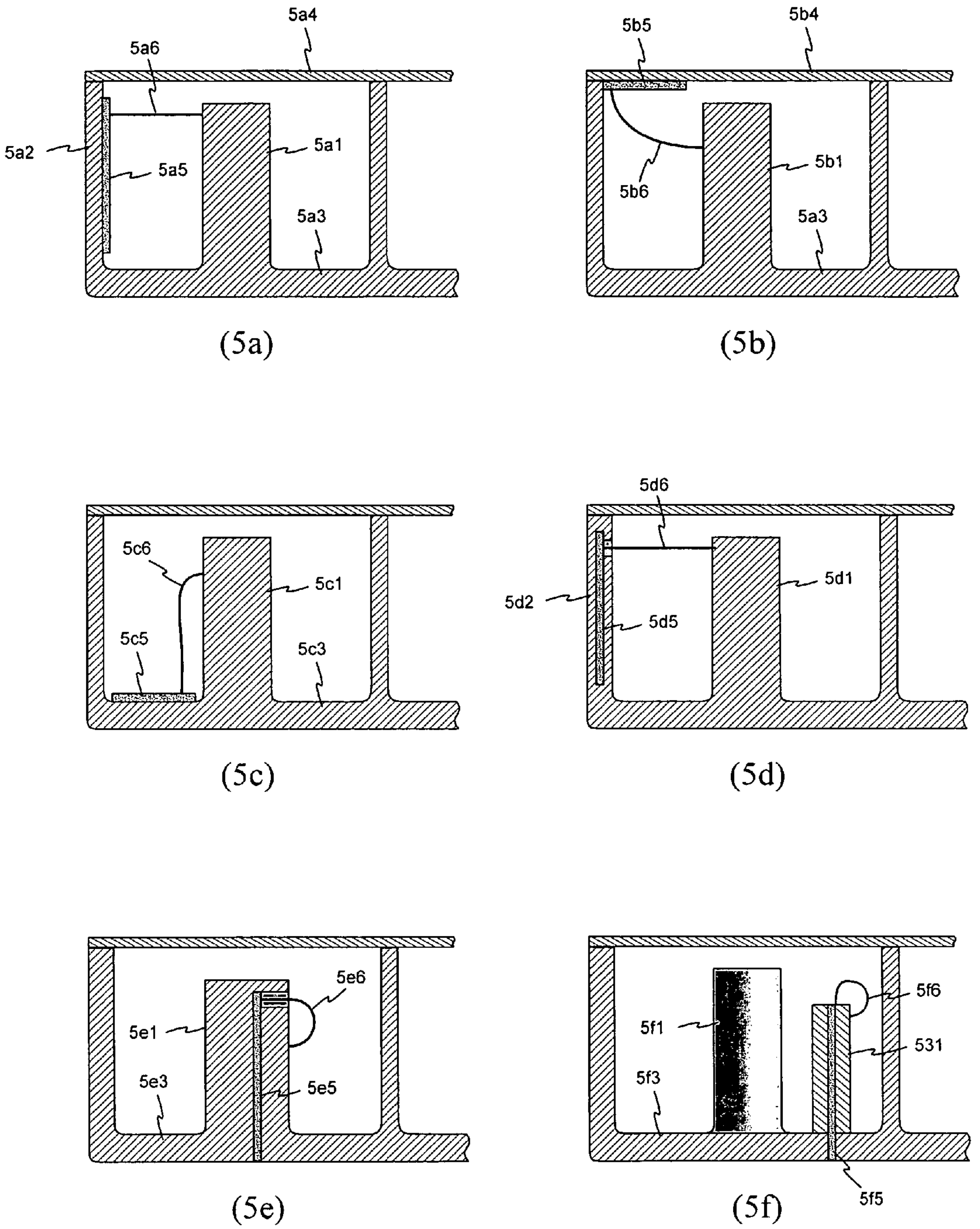
FIGS. 5*a-f* show other examples of an arrangement according to the invention for dividing the received signal.

The structure according to FIG. 5*d* corresponds to the one shown in FIG. 5*a* with the difference that the circuit board 5*d*5 including the divider proper is now within the outer wall 5*d*2 of the resonator. In FIG. 5*e*, in turn, the circuit board 5*e*5 including the divider proper is within the inner conductor 5*e*1 of the resonator, extending through the bottom 5*e*3. Energy is guided to the circuit board by means of the feed conductor 5*e*6, one end of which is also in this case galvanically connected to the inner conductor. The ground conductors of the division lines must also be on the circuit board, isolated from the inner conductor. In the structure according to FIG. 5*f*, there is a similar conductor element 531 in the cavity of the output resonator for the coupling as the conductor elements 331 and 431 in FIGS. 3 and 4. The figure is a longitudinal section at the conductor element 531. The circuit board 5*f*5 including the divider proper, is now within this conductor element, extending through the bottom 5*f*3. Energy is guided to the circuit board by means of the feed conductor 5*f*6, one end of which is galvanically coupled to the conductor element 531. The circuit board must also include the ground conductors of the division lines, as isolated from the conductor element.

The outward coupling of the signals from the resonator is not shown in FIGS. 5*a-f*. It takes place by vias in the part of the housing to which the circuit board is connected. In the cases of FIGS. 5*e* and 5*f*, the via is not needed, because the circuit board extends to the outer surface of the filter.

Examples of an arrangement according to the invention have been described above. The invention is not limited to these solutions only. For example, the resonators of the antenna filter can be of the half-wave type instead of the quarter-wave type, in which case they are shorted at both ends. They can also be ceramic instead of air-insulated. The coupling of the divider to the resonator can also be quite purely inductive or capacitive. The divider itself can also be e.g. a so-called hybrid, in which case it has a closed circuit composed of quarter-wave long parts. The inventive idea can be applied in different ways within the scope defined by the independent claim 1.

The invention claimed is:

1. An arrangement for guiding an output signal of antenna filter of a radio receiver into two parallel low-noise amplifier branches by means of a divider with division conductors connected to said branches, which antenna filter is of the resonator type, comprising a conductive filter housing, a space of which is divided by conductive partition walls into resonator cavities, in which case the filter has at least an input and output resonator, wherein the divider is located inside the outer surface of the filter housing.

2. An arrangement according to claim 1, wherein there is a conductive element in the cavity of the output resonator for taking signal energy out from the filter, the conductive element being a part of said divider, at the same time.

3. An arrangement according to claim 2, the coupling between the divider and the output resonator being electromagnetic.

4. An arrangement according to claim 2, the coupling between the divider and the output resonator being galvanic.

5. An arrangement according to claim 1, said division conductors being located for their substantial parts inside a conductive part of the filter.

6. An arrangement according to claim 5, said conductive part of the filter being an outer wall of the output resonator.

7. An arrangement according to claim 6, wherein it is a hole in said outer wall for each division conductor, in the middle of which hole the division conductor is as isolated from the surface of the hole.

8. An arrangement according to claim 5, said conductive part of the filter being the inner conductor of the output resonator.

9. An arrangement according to claim 1, said division conductors being located in the cavity of the output resonator.

10. An arrangement according to claim 9, comprising a divider circuit board, the division conductors being strip conductors, which belong to that circuit board.

11. An arrangement according to claim 10, said circuit board being fastened to inner surface of an outer wall of the output resonator.

12. An arrangement according to claim 10, said circuit board being fastened to inner surface of a cover of the output resonator.

13. An arrangement according to claim 10, said circuit board being fastened to the inner surface of a bottom of the output resonator.

14. An arrangement according to claim 1, the divider being a Wilkinson divider.

* * * * *